United States Patent
Vasudevan et al.

(10) Patent No.: US 9,213,487 B2
(45) Date of Patent: Dec. 15, 2015

(54) RECEIVER ARCHITECTURE FOR MEMORY READS

(71) Applicant: QUALCOMM Incorporated, San Diego, CA (US)

(72) Inventors: Narasimhan Vasudevan, San Diego, CA (US); Li Pan, Portland, OR (US); Michael Thomas Fertsch, San Diego, CA (US); Nan Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/055,761

(22) Filed: Oct. 16, 2013

(65) Prior Publication Data

US 2015/0106538 A1    Apr. 16, 2015

(51) Int. Cl.
*G06F 13/00* (2006.01)
*G06F 13/12* (2006.01)
*G06F 13/38* (2006.01)
*G06F 3/06* (2006.01)
*G06F 13/16* (2006.01)
*G11C 7/10* (2006.01)

(52) U.S. Cl.
CPC .............. *G06F 3/061* (2013.01); *G06F 3/0655* (2013.01); *G06F 3/0671* (2013.01); *G06F 13/1668* (2013.01); *G11C 7/10* (2013.01)

(58) Field of Classification Search
CPC ....... G06F 3/06; G06F 3/0679; G06F 3/0688; G06F 3/08
USPC .......................................... 710/74, 23, 63, 64
See application file for complete search history.

(56) References Cited

U.S. PATENT DOCUMENTS

| 5,513,377 | A | * | 4/1996 | Capowski et al. ............... 710/61 |
| 6,105,084 | A | * | 8/2000 | Dobbelaere et al. ............ 710/40 |
| 6,137,734 | A | | 10/2000 | Schoner et al. |
| 6,473,439 | B1 | | 10/2002 | Zerbe et al. |
| 6,900,660 | B2 | | 5/2005 | Piasecki et al. |
| 7,412,668 | B1 | | 8/2008 | Duong |
| 7,596,644 | B2 | * | 9/2009 | Yu et al. .......................... 710/60 |
| 8,294,488 | B1 | | 10/2012 | Derhacobian et al. |
| 2003/0056059 | A1 | * | 3/2003 | Fox et al. ....................... 711/112 |
| 2007/0118711 | A1 | * | 5/2007 | Donnelly et al. .............. 711/167 |
| 2007/0192518 | A1 | * | 8/2007 | Rupanagunta et al. ......... 710/62 |
| 2007/0250656 | A1 | * | 10/2007 | Rupp ............................. 710/317 |
| 2009/0019184 | A1 | | 1/2009 | Skerlj et al. |

OTHER PUBLICATIONS

International Search Report and Written Opinion—PCT/US2014/060752—ISA/EPO—Feb. 19, 2015.

\* cited by examiner

*Primary Examiner* — Idriss N Alrobaye
*Assistant Examiner* — Getente A Yimer
(74) *Attorney, Agent, or Firm* — Novak Druce Connolly Bove + Quigg LLP

(57) ABSTRACT

A receiver architecture for memory reads is described herein. In one embodiment, a memory interface comprises a plurality of transmitters, wherein each of the plurality of transmitters is configured to transmit data to a memory device over a respective one of a plurality of I/O channels. The memory interface also comprises a plurality of receivers, wherein each of the plurality of receivers is coupled to a respective one of the plurality of transmitters, and is configured to receive data from the memory device over the respective one of the plurality of I/O channels. The plurality of receivers are grouped together into a receiver subsystem that is located away from the plurality of transmitters.

15 Claims, 6 Drawing Sheets

RECEIVER ARCHITECTURE FOR MEMORY READS

BACKGROUND

1. Field

Aspects of the present disclosure relate generally to memory, and more particularly, to a receiver architecture for memory reads.

2. Background

A chip may include a memory interface for interfacing circuits (e.g., a memory controller) on the chip with an external memory device, such as a dynamic random access memory (DRAM). To read data from the memory device, the memory interface receives a plurality of data signals in parallel from the memory device over a plurality of I/O channels. The memory interface may also receive a data strobe signal from the memory device, and use the received data strobe signal to time the capture of data bits from the received data signals. Interfacing with a high-speed DRAM (e.g., a double data rate (DDR) synchronous DRAM (SDRAM)) can be extremely challenging because the high speeds translate into tight timing constraints that need to be met by the memory interface in order to properly read data from the DRAM.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to an aspect, a memory interface is described herein. The memory interface comprises a plurality of transmitters, wherein each of the plurality of transmitters is configured to transmit data to a memory device over a respective one of a plurality of I/O channels. The memory interface also comprises a plurality of receivers, wherein each of the plurality of receivers is coupled to a respective one of the plurality of transmitters, and is configured to receive data from the memory device over the respective one of the plurality of I/O channels. The plurality of receivers are grouped together into a receiver subsystem that is located away from the plurality of transmitters.

A second aspect relates to a method for transferring data. The method comprises transmitting data to a memory device over a plurality of I/O channels using a plurality of transmitters, and receiving data from the memory device over the plurality of I/O channels using a plurality of receivers. Each of the plurality of I/O channels is coupled to a respective one of the plurality of transmitters and a respective one of the plurality of receivers, and the plurality of receivers are grouped together into a receiver subsystem that is located away from the plurality of transmitters.

A third aspect relates to an apparatus for transferring data. The apparatus comprises means for transmitting data to a memory device over a plurality of I/O channels, and means for receiving data from the memory device over the plurality of I/O channels. The means for receiving is located away from the means for transmitting.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
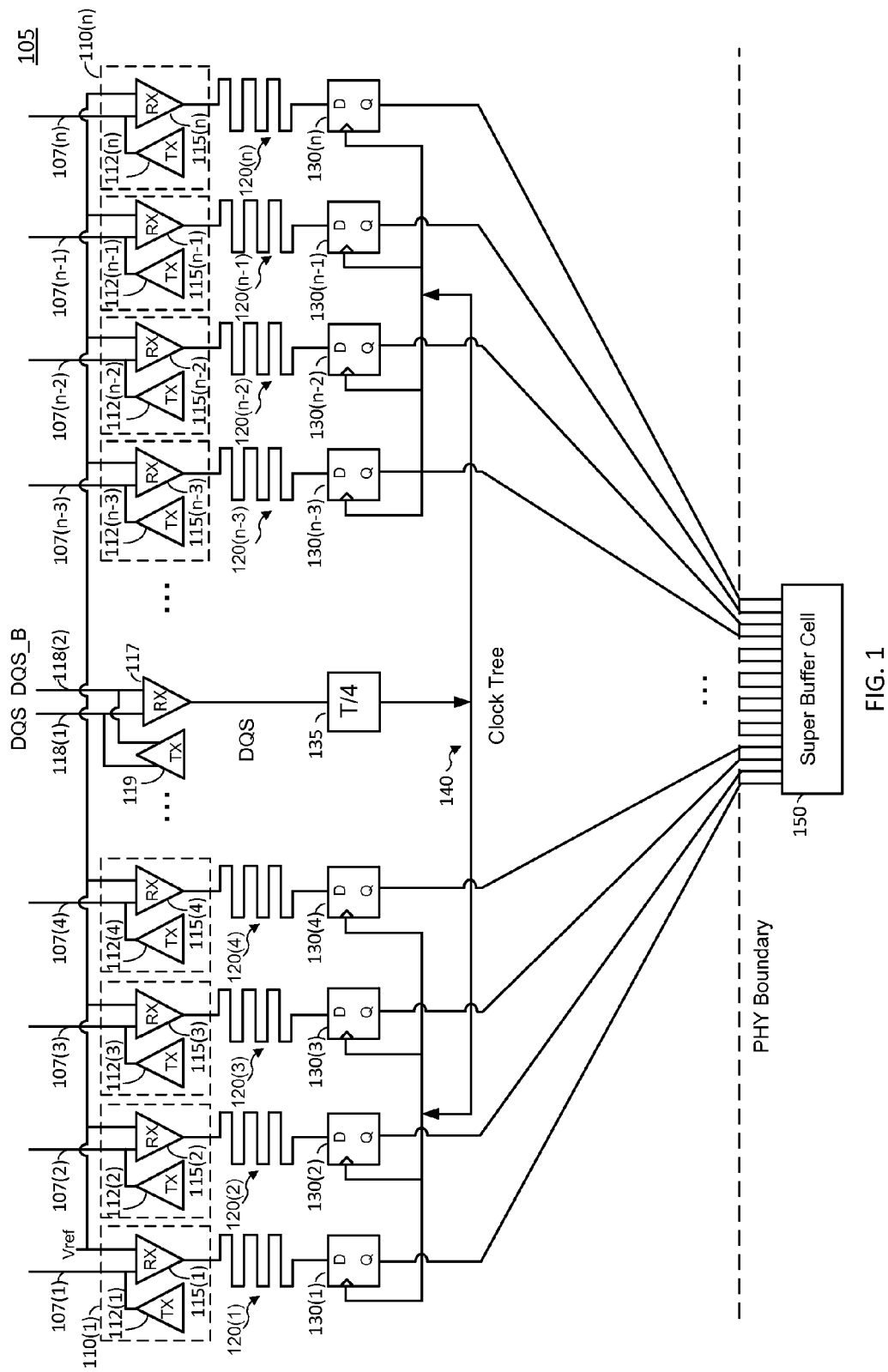
FIG. 1 shows an example of a memory interface for interfacing with an external memory device.

FIG. 1 shows an example of a memory interface 105 for interfacing a chip with an external DRAM (not shown in FIG. 1). The memory interface 105 includes a plurality of transceivers 110(1)-110(n), a plurality of data delay paths 120(1)-120(n), a plurality of data-capture devices 130(1)-130(n) (e.g., flip-flops), a data strobe receiver 117, a data strobe transmitter 119, a delay device 135, and a clock tree 140.

The memory interface 105 is configured to transmit data to and receive data from the DRAM over a plurality of bi-directional I/O channels 107(1)-107(n). Each bi-directional I/O channel 107(1)-107(n) may comprise a conductive trace on a board, a wire, a transmission line, or any combination thereof. Each transceiver 110(1)-110(n) is coupled to one of the I/O channels 107(1)-107(n). This allows the memory interface 105 to transmit a plurality of data bits in parallel (e.g., a data byte) or receive a plurality of data bits in parallel (e.g., a data byte) at a time, where each of the data bits is transported on one of the I/O channels 107(1)-107(n).

Each transceiver 110(1)-110(n) comprises a transmitter 112(1)-112(n) and a receiver 115(1)-115(n) coupled to the respective I/O channel 107(1)-107(n) Each transmitter 112(1)-112(n) is configured to receive a data signal (sequence of data bits) to be transmitted to the DRAM, and to drive the respective I/O channel 107(1)-107(n) with the data signal. For example, the transmitters 112(1)-112(n) may be used during write operations to send write data to the DRAM.

Each receiver 115(1)-115(n) is configured to receive a data signal from the DRAM via the respective I/O channel 107(1)-

107(n) For example, the receivers 115(1)-115(n) may be used during read operations to receive data read from the DRAM. When a receiver 115(1)-115(n) receives a data signal from the DRAM, the receiver 115(1)-115(n) compares the voltage of the received data signal with a reference voltage Vref, and outputs a signal to a respective one of the data-capture devices 130(1)-130(n) (e.g., flip-flop) based on the comparison. For example, Vref may be approximately in the center of the voltage swing of the data signal, and the receiver 115(1)-115(n) may output a logic one when the voltage of the data signal is above Vref, and output a logic zero when the voltage of the data signal is below Vref.

During data writes, the strobe transmitter 119 is configured to transmit a differential strobe signal (DQS and DQS_B) to the DRAM via I/O channels 118(1) and 118(2). The edges of the transmitted strobe signal are centered between transitions of the transmitted data signals. The strobe signal is used to time data capture at the DRAM.

During data reads, the strobe receiver 117 is configured to receive a differential data strobe signal (DQS and DQS_B) from the DRAM via I/O channels 118(1) and 118(2), and output a single-ended data strobe signal to the delay device 135. The data strobe signal is a periodic signal used to capture data at the data-capture devices 130(1)-130(n), as discussed further below. The delay device 135 is configured to delay the data strobe signal by a quarter of a period (T/4). This is done because the DRAM outputs the differential data strobe signal with the edges of the strobe signal approximately aligned with the transitions of the data signals. Delaying the data strobe signal by a quarter of a period approximately aligns the edges of the data strobe signal with the center of the data eye (valid data window) of the received data signals.

Figure 2:
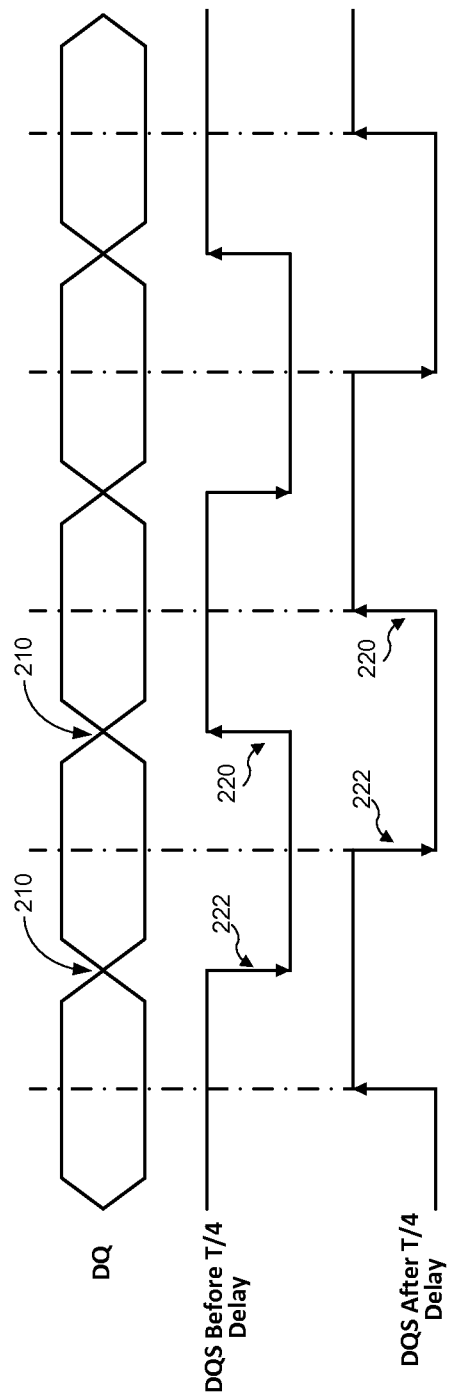
FIG. 2 is a timing diagram illustrating an example of timing between a data signal and a data strobe.

FIG. 2 shows a simplified example of the timing relationship between a data signal (denoted DQ) and a data strobe signal (denoted DQS). In this example, the rising and falling edges 220 and 222 of the received data strobe signal DQS are approximately aligned with the transitions 210 of the data signal DQ. After being delayed by a quarter of a period delay (T/4) the rising and falling edges 220 and 222 of the data strobe signal DQS are approximately centered between transitions of the data signal DQ, as shown in FIG. 2. The respective data-capture device 130(1)-130(n) (e.g., flip-flop) may then capture data from the data signal DQ on both the rising and falling edges 220 and 222 of the delayed data strobe signal DQS. Centering the rising and falling edges 220 and 222 between transitions of the data signal DQ helps ensure that setup time and hold time requirements of the data capture device 130(1)-130(n) are met.

The simplified example in FIG. 2 assumes no skews between the data strobe signal and the data signals. In practice, the I/O channels 107(1)-107(n) 118(1) and 118(2), the data delay paths 120(1)-120(n), and the clock tree 140 introduce skews that cause the timing relationships between the data strobe signal and the data signals to deviate from the ideal case shown in FIG. 2, as discussed further below.

The clock tree 140 distributes the data strobe signal from the delay device 135 to each of the data-capture devices 130(1)-130(n). Each of the data-capture devices 130(1)-130(n) receives the respective data signal from the respective receiver 115(1)-115(n) via the respective data delay path 120(1)-120(n), and captures data from the data signal on the rising and falling edges of the data strobe signal received from the clock tree 140. Each data-capture device 130(1)-130(n) outputs the respective captured data to a buffer cell 150 for further processing (e.g., by a memory controller).

For high data rates (e.g., one GHz), the data eye (valid data window) of the data signals becomes very small, which places tighter timing constraints on the data signals and the data strobe signal. As a result, the amount of skew that can be tolerated at a data-capture device 130(1)-130(n) to reliably capture data (e.g., read data) is reduced.

In the memory interface 105 shown in FIG. 1, the receivers 115(1)-115(n) are spread out over a relatively wide distance (e.g., 1 mm to 2 mm). This is because each receiver 115(1)-115(n) is placed next to the respective transmitter 112(1)-112(n), which is typically much larger than the receiver 115(1)-115(n). As a result, the receivers 115(1)-115(n) are separated from one another by the transmitters 112(1)-112(n). In addition, each receiver-transmitter pair may be placed next to the respective I/O contact (not shown) on the chip, in which the I/O contacts (e.g., contact pins or pads) for the different I/O channels are spread out over a wide distance (e.g., 1 mm to 2 mm).

Because the receivers 115(1)-115(n) are spread out over a wide distance, the clock tree 140 has to route the data strobe signal to the data-capture devices 130(1)-130(n) over a large area. As a result, the lengths of the clock paths in the clock tree 140 are relatively long. This makes it very difficult to match the delays in the clock tree 140 with the delays in the data delay paths 120(1)-120(n) in order to maintain the proper timing relationships between the data signals and the data strobe signal. In practice, delay mismatches between the clock tree 140 and the data delay paths 120(1)-120(n) (e.g., due to trace mismatches) may be reduced by placing one or more buffers (not shown) in the clock tree 140 and/or the data delay paths 120(1)-120(n). However, this approach involves a significant amount of design work. For example, the delays of the buffers are sensitive to process, voltage and temperature variations, making it difficult to achieve delay matching using the buffers. In addition, the use of buffers introduces noise and increases power consumption. Another drawback is that the close proximity between the receivers 115(1)-115(n) and the transmitters 112(1)-112(n) allows noise from the transmitters 112(1)-112(n) to be coupled into the receivers 115(1)-115(n).

Embodiments of the present disclosure provide a novel receiver architecture, in which the receivers used to receive data from the external DRAM are grouped together into a receiver subsystem that is located away from the transmitters used to transmit data to the external DRAM. Because the receivers are grouped together, the span of the receivers can be significantly reduced compared with the receiver architecture in FIG. 1. In addition, the data-capture devices (e.g., flip-flops) are grouped together and placed in close proximity to the receivers. As a result, the size of the data paths from the receivers to the data-capture devices 130(1)-130(n) and the size of the clock tree are significantly reduced compared with the receiver architecture in FIG. 1. This makes it much easier to match delays in the data paths and the clock tree, and therefore meet the tight timing constraints for high-speed read operations.

Figure 3:
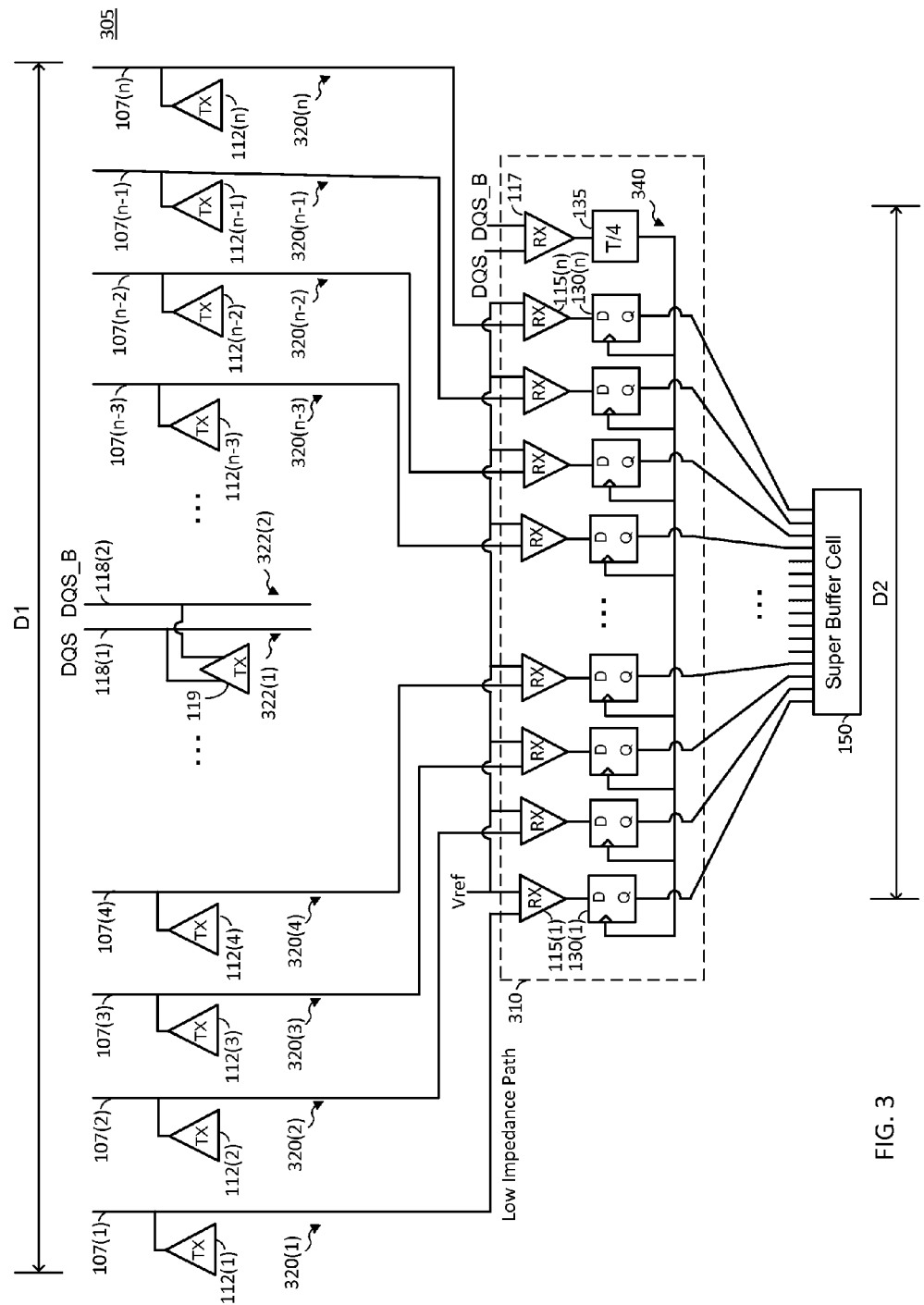
FIG. 3 shows a memory interface for interfacing with an external memory device according to an embodiment of the present disclosure.

FIG. 3 shows a block diagram of a memory interface 305 according to an embodiment of the present disclosure. In this embodiment, the receivers 115(1)-115(n) and 117 are grouped together in a receiver sub-system 310, which is located away from the transmitters 112(1)-112(n) and 119. As a result, the receivers 115(1)-115(n) and 117 can be spaced closely together without intervening transmitters, as shown in FIG. 3. For example, the receivers 115(1)-115(n) and 117 may span a distance D2 that is much shorter than the distance D1 spanned by the transmitters 112(1)-112(n) and 119. For example, the transmitters 112(1)-112(n) and 119 may span a distance D1 of 1 mm to 2 mm while the receivers 115(1)-115

(n) and 117 may span a much shorter distance D2 of 200 μm or less. It is to be appreciated that FIG. 3 is not drawn to scale for ease of illustration.

In addition, the data-capture devices 130(1)-130(n) are grouped together and placed in close proximity to the receivers 115(1)-115(n) and 117 in the receiver sub-system 310. As a result, the lengths of the data paths from the receivers 115(1)-115(n) to the respective data-capture devices 130(1)-130(n) are much shorter compared with the receiver architecture shown in FIG. 1. Also, the size of the clock tree 340 is much smaller compared with the receiver architecture in FIG. 1. This makes it much easier to match delays in the data paths and the clock tree, and therefore meet the tight timing constraints for high-speed read operations. For example, delay matching may be achieved using smaller buffers and a simple clock buffer, which reduce power consumption. Although not shown in FIG. 3, it is to be appreciated that the clock tree 340 may have multiple levels of branches for distributing the delayed strobe signal to the data-capture devices.

Further, because the data-capture devices 130(1)-130(n) are grouped together, the outputs of the data-capture devices 130(1)-130(n) are spaced close together. This allows the routing between the data-capture devices 130(1)-130(n) and the buffer cell 150 to be significantly reduced compared with the receiver architecture in FIG. 1, in which the outputs of the data-capture devices are spread out.

Locating the receivers 115(1)-115(n) and 117 away from the transmitters 112(1)-112(n) and 119 provides better isolation between the transmitters 112(1)-112(n) and 119 and the receivers 115(1)-115(n) and 117, thereby reducing noise coupling between the transmitters 112(1)-112(n) and 119 (which may be noisy) and the receivers 115(1)-115(n) and 117. For example, the receivers 115(1)-115(n) and 117 may be located away from the pad ring of the chip.

The memory interface 305 may include a plurality of low-impedance paths 320(1)-320(n) that couple each receiver 115(1)-115(n) to the respective I/O channel 107(1)-107(n), and low-impedance paths 322(1) and 322(2) that couple the data strobe receiver 117 to the I/O channels 118(1) and 118(2). In FIG. 3, the connections between the low-impedance paths 322(1) and 322(2) and the strobe receiver 117 are not explicitly shown for ease of illustration.

The low-impedance paths 320(1)-320(n), 322(1) and 322(2) route data signals from the I/O contacts (e.g., contact pins or pads), which may be located on the periphery of the chip, to the receivers 115(1)-115(n) and 117, which may be located away from the periphery of the chip. In one embodiment, most of the low-impedance paths 320(1)-320(n), 322(1) and 322(2) may be routed between the transmitters, as shown in FIG. 3.

In one embodiment, each low-impedance path 320(1)-320(n), 322(1) and 322(2) may be implemented using a redistribution layer (RDL). A RDL is typically used on a chip to provide signal routing between I/O contacts (e.g., contact pins or pads) located on the periphery of the chip and I/O contacts (e.g., solder bump contacts) located away from the periphery of the chip. In this embodiment, the RDL is used to provide signal routing between the I/O contacts (e.g., contact pins or pads) and the receivers 115(1)-115(n) and 117.

Figure 4:
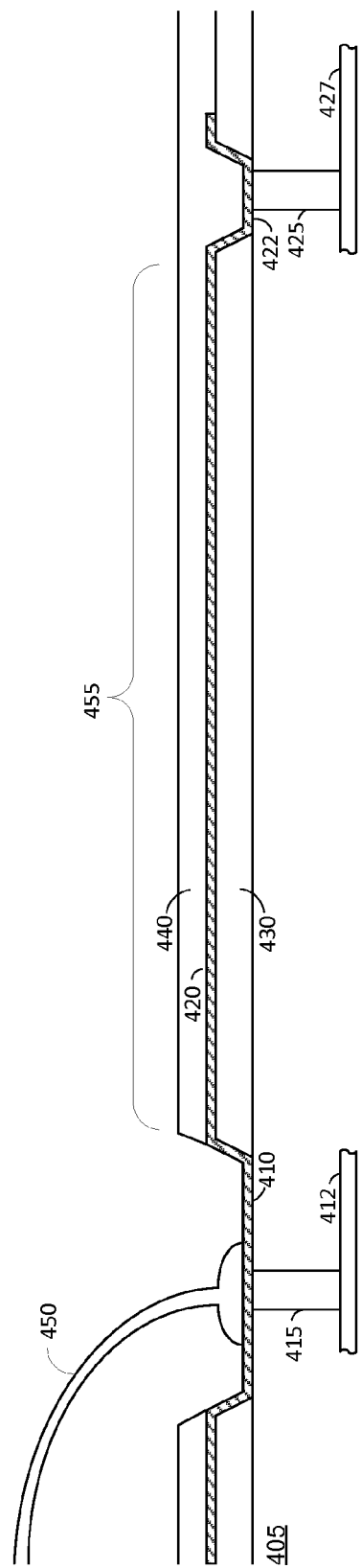
FIG. 4 shows a redistribution layer for providing a low-impedance path between an I/O contact and a receiver according to an embodiment of the present disclosure.

FIG. 4 shows an example of a RDL 420 that may be used to implement any one of the low-impedance paths 320(1)-320(n), 322(1) and 322(2). The RDL 420 may have a relatively large width (e.g., on the order of a few microns to tens of microns), and may comprise copper, aluminum, titanium, other conductive material, or any combination thereof. The RDL 420 may be deposited over a first passivation layer 430 on the chip (die), and a second passivation layer 440 may be deposited over the RDL 420. Each passivation layer may comprise nitride, oxide, polyimide, other dielectric material, or any combination thereof.

The RDL 420 comprises a first portion 410 that that is electrically connected to a first via 415 through an opening in the first passivation layer 430. The first portion 410 of the RDL 420 may be directly connected to the first via 415, or connected to the first via 415 by one or more intervening metal layers. The first via 415 connects the first portion of the RDL 410 to a first metal interconnect 412 of the chip. The first metal interconnect 412 may be connected to one of the transmitters 112(1)-112(n) and 119 (not shown in FIG. 4). The first metal interconnect 412 may be connected to the transmitter through one or more other intervening metal interconnects (not shown) corresponding to different layers of the chip.

The RDL 420 also comprises a second portion 422 that is electrically connected to a second via 425 through another opening in the first passivation layer 430. The second portion of 422 of the RDL 420 may be directly connected to the second via 425, or connected to the second via 425 by one or more intervening metal layers. The second via 425 connects the second portion 422 of the RDL 420 to a second metal interconnect 427 of the chip. The second metal interconnect 427 may be connected to one of the receivers 115(1)-155(n) and 117 (not shown in FIG. 4). The second metal interconnect 427 may be connected to the receiver through one or more other intervening metal interconnects (not shown) corresponding to different layers of the chip. The first and second metal interconnects 412 and 427 may be formed from the same metal layer of the chip or different metal layers.

In the example shown in FIG. 4, the second passivation layer 440 has an opening exposing the first portion 410 of the RDL 420. This allows a wire 450 or other type of conductor (e.g., bump) to be bonded to the first portion 410 of the RDL 420 for connecting the RDL 420 to the external DRAM. The wire 450 or other type of conductor may be directly bonded to the first portion 410 of the RDL 420 or bonded to the first portion 410 of the RDL 420 through one or more intervening metal layers. The first portion 410 of the RDL 420 may be located on the periphery of the chip.

Thus, the first portion of the RDL 420 is coupled to one of the transmitters 112(1)-112(n) and 119 and the second portion 422 of the RDL 420 is coupled to one of the receivers 115(1)-115(n) and 117. The transmitter and the receiver correspond to the same I/O channel with the first portion 410 of the RDL forming an I/O contact for coupling the transmitter and receiver to the DRAM. The portion 455 of the RDL 420 between the first and second portions 410 and 422 of the RDL 420 forms a low-impedance path between the I/O contact and the receiver.

FIG. 4 shows a side view of the RDL 420. It is to be appreciated that, from a top view, the portion 455 of the RDL 420 forming the low-impedance path may be patterned into different shapes to define different paths between the I/O contact and the receiver. The RDL 420 may be disposed above the metal interconnect layers of the chip, and therefore routed over the metal interconnect layers of the chip, providing greater flexibility in routing the RDL 420. The RDL 420 may have a length of 400 μm or more for routing signals between the I/O contact and the receiver.

It is to be appreciated that the opening in the second passivation 440 is not limited to the location shown in FIG. 4, and may be moved to a different location along the RDL 420 to expose a different portion of the RDL 420. Thus, the exposed portion of the RDL 420, and hence the portion of the RDL 420 forming the I/O contact, may be different from the example shown in FIG. 4.

Figure 5:
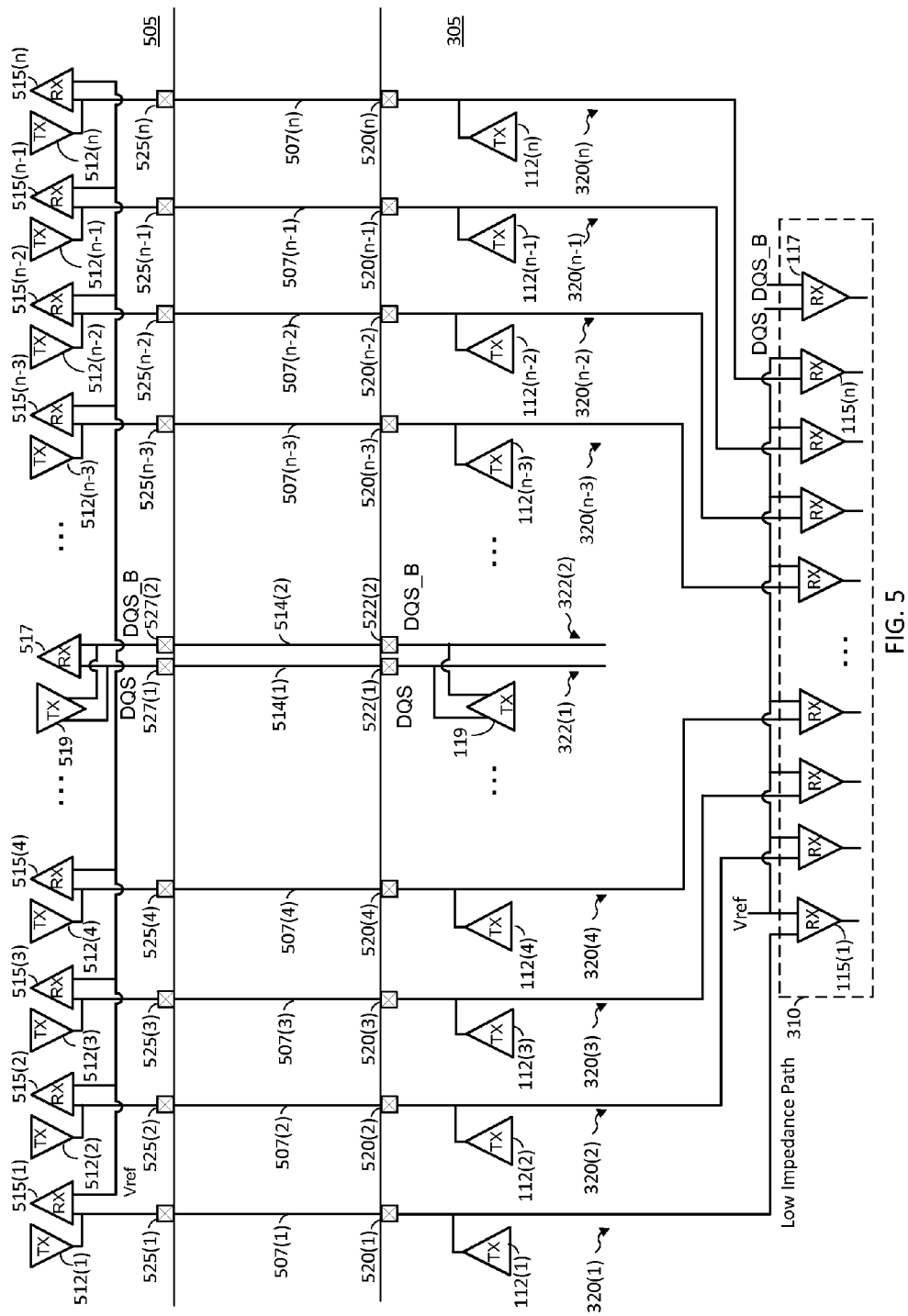
FIG. 5 shows the memory interface in FIG. 3 in communication with an external memory device according to an embodiment of the present disclosure.

FIG. 5 shows an example of the memory interface 305 coupled to an external DRAM 505 according to an embodiment of the present disclosure. The memory interface 305 and DRAM 505 communicate over a plurality of bi-directional I/O channels 507(1)-507(n), 514(1) and 514(2). Each I/O channel may comprise a conductive trace on a board, a wire, a transmission line, or any combination thereof. Each transmitter 112(1)-112(n) and receiver 115(1)-115(n) pair is coupled to the respective I/O channel via a respective I/O contact (e.g., contact pin or pad) 520(1)-520(n), which may be located on the periphery of the chip. The strobe transmitter 119 and the strobe receiver 117 may be coupled to I/O channels 514(1) and 514(2) via respective I/O contacts 522(1) and 522(2).

The DRAM 505 comprises a transmitter 512(1)-512(n) and a receiver 515(1)-515(n) for each I/O channel 507(1)-507(n). Each transmitter 512(1)-512(n) and receiver 515(1)-515(n) pair is coupled to the respective I/O channel 507(1)-507(n) via a respective I/O contact (e.g., contact pin or pad) 525(1)-525(n), which may be located on the periphery of the DRAM chip. The transmitter 512(1)-512(n) and receiver 515(1)-515(n) pair for each I/O channel 507(1)-507(n) allows the DRAM 505 to transmit data to and receive data from the memory interface 305 over the respective I/O channel.

The DRAM 505 also comprises a data strobe transmitter 519 for transmitting a differential data strobe signal (DQS and DQS_B) to the memory interface 305 and a data strobe receiver 517 for receiving a differential data signal (DQS and DQS_B) from the memory interface 305. The strobe transmitter 519 and strobe receiver 517 are coupled to I/O channels 514(1) and 514(2) via I/O contacts 527(1) and 527(2). When the transmitters 512(1)-512(n) of the DRAM 505 transmit data signals (e.g., read data) to the memory interface 305 over the I/O channels 507(1)-5079n), the strobe transmitter 519 transmits a differential data strobe signal (DQS and DQS_B) with the edges of the strobe signal aligned with the transitions of the data signals. When the receivers 515(1)-515(n) receive data signals (e.g., write data) from the memory interface 305, the strobe receiver 517 receives a differential data strobe signal (DQS and DSQ_B) from the memory interface 305.

Thus, the I/O channels 507(1)-507(n), 514(1) and 514(2) may be used for bi-directional communication between the memory interface 305 and the DRAM 505. During write operations, the transmitters 112(1)-112(n) of the memory interface 305 drive the I/O channels 507(1)-507(n) with data signals (e.g., write data). The receivers 515(1)-515(n) of the DRAM 505 receive the data signals from the I/O channels 507(1)-507(n), and output the received data signals to data-capture devices (not shown) in the DRAM 505. The strobe transmitter 119 transmits a differential strobe signal with the edges of the data strobe signal centered between transitions of the data signals. The strobe receiver 517 of the DRAM 505 receives the strobe signal from the I/O channels 514(1) and 514(2), and inputs the received strobe signal to the data-capture devices (e.g., flip-flops) of the DRAM 505 to capture data from the data signals received from the memory interface 305.

During read operations, the transmitters 515(1)-515(n) of the DRAM 505 drive the I/O channels 507(1)-507(n) with data signals (e.g., read data). The receivers 115(1)-115(n) of the memory interface 305 receive the data signals from the I/O channels 507(1)-507(n) via the low-impedance paths 320(1) and 320(n), and output the received data signals to the data-capture devices 130(1)-130(n) (e.g., flip-flops). The strobe transmitter 519 of the DRAM 505 transmits a differential data strobe signal (DQS and DQS_B) with the edges of the strobe signal aligned with the transitions of the data signal. The strobe receiver 117 of the memory interface 305 receives the strobe signal from the I/O channels 514(1) and 514(2) via the low-impedance paths 322(1) and 322(2). The delay element 135 delays the received strobe signal by a quarter of a period (T/4), and the outputs the delayed strobe signal to the data-capture devices 130(1)-130(n), which capture the received data signals on rising and falling edges of the delayed strobe signal.

Thus, during read operations, the low-impedance paths 320(1)-320(n) of the memory interface 305 are driven by the transmitters 512(1)-512(n) of the external DRAM 505. In contrast, the data delay paths 120(1)-120(n) in FIG. 1 are driven by the receivers 115(1)-115(n) of the memory interface 305. The transmitters 512(1)-512(n) of the DRAM 505 may have much lower output impedance and much higher driving strength than the receivers 115(1)-115(n). For example, each of the transmitters 512(1)-512(n) may have an output impedance of less than 100Ω (e.g., 30 to 50Ω) while each of the receivers 115(1)-115(n) may have a high output impedance of several thousand ohms.

As a result, signal propagation on the low-impedance paths 320(1)-320(n) is faster than signal propagation on the data delay paths 120(1)-120(n). The faster signal propagation results in much smaller skew for a given amount of trace mismatch between the low-impedance paths 320(1)-320(n) compared with the delay paths 120(1)-120(n) in FIG. 1. Thus, any mismatch in the lengths of the low-impedance paths 320(1)-320(n) causes much less skew between the received data signals compared with the data delay paths 120(1)-120(n).

Also, the low-impedance paths 322(1)-322(2) of the memory interface 305 are driven by the strobe transmitter 519 of the external DRAM 505. In contrast, the clock tree 140 in FIG. 1 is driven by the strobe receiver 117 of the memory interface 305. The transmitter 519 of the DRAM 505 may have much lower output impedance and much higher driving strength than the receiver 117 of the memory interface 305. For example, the strobe transmitter 519 may have an output impedance of less than 100Ω (e.g., 30 to 50Ω) while the strobe receiver 117 may have a high output impedance of several thousand ohms.

As a result, signal propagation on the low-impedance paths 322(1) and 322(2) is faster than signal propagation on the clock tree 140. The faster signal propagation results in much smaller skew for a given amount of trace mismatch between the low-impedance paths 320(1)-320(n), 322(1) and 322(2). Thus, any mismatch in the lengths of the low-impedance paths 32(1)-320(n), 322(1) and 322(2) causes much less skew between the received data signals and the data strobe signal.

Because the resistance of each low-impedance path 320(1)-320(n) is small, the delay through each low-impedance path 320(1)-320(n) is small. For each transmitter 512(1)-512(n), the delay through the entire path from the transmitter 512(1)-512(n) to the respective receiver 115(1)-115(n) is proportional to a resistance-capacitance (RC) product. For each path, R includes the impedance of the respective transmitter 512(1)-512(n), the resistance of the respective channel 507(1)-507(n) (e.g., printed circuit board (PCB) trace), and the resistance of the respective low-impedance line 320(1)-320(n), and C includes the capacitance of the respective channel 507(1)-507(n) (e.g., PCB trace), the capacitance of the respective low-impedance path 320(1)-320(n), and the capacitance of the respective receiver 115(1)-115(n). In practical systems, R for each path is dominated by the impedance of the respective transmitter 512(1)-512(n), and C for each path is dominated by the capacitance of the respective channel 507(1)-507(n) (e.g., PCB trace). Thus, mismatches in the resistances and capacitances of the low-impedance paths 320 (1)-320(n) do not affect system timing significantly, and, as a result, the receiver architecture according to embodiments of the present disclosure has significantly reduced requirements for line length matching compared with the receiver architecture in FIG. 1.

It is to be appreciated that embodiments of the present disclosure are not limited to the numerical ranges given in the examples above. For instance, the span of the transmitters 112(1)-112(n) and 119 is not limited to a range of 1 mm to 2 mm and the span of the receivers 115(1)-115(n) and 117 is not limited to a span of 200 µm or less. It is to be appreciated that these ranges may scale down with advances in fabrication technology, and that the span of the transmitters 112(1)-112(n) and 119 and the span of the receivers 115(1)-115(n) and 117 may scale down at the same rate or different rates. For example, if the dimensions of transistors scale down at a faster rate than the dimensions of the I/O contacts (e.g., contact pins and pads), then the span of the receivers 115(1)-115(n) and 117 may be reduced even further relative to the span of the transmitters 112(1)-112(n) and 119. Generally, in one embodiment of the present disclosure, the span of the transmitters 112(1)-112(n) and 119 is at least five time longer than the span of the receivers 115(1)-115(n) and 117.

Figure 6:
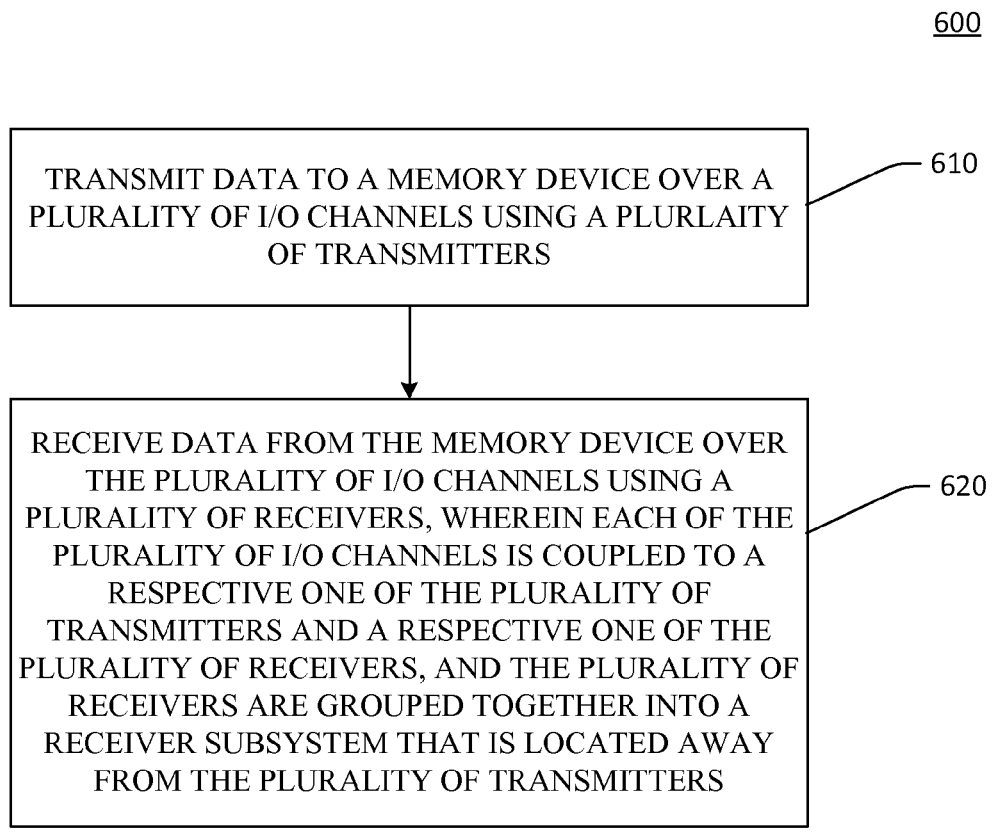
FIG. 6 is a flow diagram of a method for transferring data according to an embodiment of the present disclosure.

FIG. 6 is a flow diagram of a method 600 for transferring data according to an embodiment of the present disclosure. The method 600 may be performed by the memory interface 305 for transferring data between the memory interface 305 and the DRAM 505.

In step 610, data is transmitted to a memory device over a plurality of I/O channels using a plurality of transmitters. For example, the data (e.g., write data) may be transmitted from a plurality of transmitters (e.g., transmitters 112(1)-112(n)) to the memory device (e.g., DRAM 505) over a plurality of I/O channels (e.g., I/O channels 507(1)-507(n)).

In step 620, data is received from the memory device over the plurality of I/O channels using a plurality of receivers, wherein each of the plurality of I/O channels is coupled to a respective one of the plurality of transmitters and a respective one of the plurality of receivers, and the plurality of receivers are grouped together into a receiver subsystem that is located away from the plurality of transmitters. For example, the data (e.g., read data) may be received from the memory device (e.g., DRAM 505) by a plurality of receivers (e.g., receivers 115(1)-115(n)). The inputs of the receivers (e.g., receivers 115(1)-115(n)) may be driven by transmitters (e.g., transmitters 512(1)-512(n)) of the memory device (e.g., DRAM 505) with data signals carrying the data.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. For example, although embodiments of the present disclosure are discussed above using an example of a DRAM, it is to be appreciated that embodiments of the present disclosure are not limited to this example, and may be used with other types of memory devices. Thus, the disclosure is not intended to be limited to the examples described herein but is to be accorded the widest scope consistent with the principles and novel features disclosed herein.

What is claimed is:

1. A memory interface, comprising:
a plurality of transmitters, wherein each of the plurality of transmitters is configured to transmit data to a memory device over a respective one of a plurality of I/O channels;
a plurality of receivers, wherein each of the plurality of receivers is coupled to a respective one of the plurality of transmitters, and is configured to receive data from the memory device over the respective one of the plurality of I/O channels; and
a plurality of flip-flops located in close proximity to the plurality of receivers, wherein each of the flip-flops is configured to capture data from an output of a respective one of the plurality of receivers;
wherein the plurality of receivers and the plurality of flip-flops are all grouped together into a receiver subsystem that is located away from the plurality of transmitters, the plurality of transmitters span a first distance, the receiver subsystem spans a second distance, and the first distance is at least five times longer than the second distance.

2. The memory interface of claim 1, wherein the plurality of receivers comprise at least eight receivers, and the plurality of receivers span a distance of 200 µm or less.

3. The memory interface of claim 2, wherein the plurality of transmitters comprise at least eight transmitters, and the plurality of transmitters span a distance of at least 1 mm.

4. The memory interface of claim 1, further comprising a plurality of low-impedance paths, wherein each of the low-impedance paths is configured to couple one of the plurality of receivers to the respective one of the plurality of I/O channels.

5. The memory interface of claim 4, wherein each of the low-impedance paths is configured to be driven by a respective one of a plurality of transmitters of the memory device, and the memory interface and the memory device are located on different chips.

6. The memory interface of claim 5, wherein each of the transmitters has an impedance of 100 ohms or less.

7. The memory interface of claim 5, wherein each of the plurality of transmitters of the memory interface is configured to drive a respective one of a plurality of receivers of the memory device.

8. The memory interface of claim 4, wherein each of the low-impedance paths is implemented using a redistribution layer (RDL) of a chip.

9. The memory interface of claim 1, further comprising:
a strobe receiver configured to receive a data strobe signal from the memory device; and
a delay device configured to delay the received data strobe signal;
wherein each of the plurality of flip-flops is configured to capture data from the output of the respective one of the plurality of receivers using the delayed data strobe signal.

10. The memory interface of claim 1, further comprising:
a strobe receiver configured to receive a data strobe signal from the memory device; and
a delay device configured to delay the received data strobe signal;
wherein each of the plurality of flip-flops is configured to capture data from the output of the respective one of the plurality of receivers using the delayed data strobe signal, and each of the plurality of transmitters is configured to drive the respective one of the plurality of I/O channels with data.

11. A method for transferring data, comprising:
- transmitting data to a memory device over a plurality of I/O channels using a plurality of transmitters;
- receiving data from the memory device over the plurality of I/O channels using a plurality of receivers, wherein each of the plurality of I/O channels is coupled to a respective one of the plurality of transmitters and a respective one of the plurality of receivers; and
- capturing data from outputs of the plurality of receivers using a plurality of flip-flops located in close proximity to the plurality of receivers;
- wherein the plurality of receivers and the plurality of flip-flops are all grouped together into a receiver subsystem that is located away from the plurality of transmitters, the plurality of transmitters span a first distance, the receiver subsystem spans a second distance, and the first distance is at least five times longer than the second distance.

12. The method of claim 11, wherein receiving the data from the memory device over the plurality of I/O channels comprises receiving the data over a plurality of low-impedance paths coupled between a plurality of I/O contacts and the plurality of receivers, wherein the plurality of I/O contacts are coupled to the plurality of I/O channels, and the plurality of I/O contacts and the plurality of receivers are located on the same chip.

13. The method of claim 12, wherein each of the low-impedance paths is driven by a respective one of a plurality of transmitters of the memory device.

14. The method of claim 12, wherein each of the low-impedance paths is implemented using a redistribution layer (RDL) of the chip.

15. The method of claim 11, further comprising:
- receiving a data strobe signal from the memory device;
- delaying the received data strobe signal; and
- capturing data from the outputs of the plurality of receivers using the plurality of flip-flops and the delayed data strobe signal.

* * * * *